United States Patent [19]

Leuthold

[11] 4,280,175

[45] Jul. 21, 1981

[54] ALTERNATING TO DIRECT VOLTAGE CONVERTER

[75] Inventor: Oskar Leuthold, Marin, Switzerland

[73] Assignee: Ebauches Electroniques SA, Marin, Switzerland

[21] Appl. No.: 162,464

[22] Filed: Jun. 24, 1980

[30] Foreign Application Priority Data

Jul. 13, 1979 [CH] Switzerland .......................... 6543/79

[51] Int. Cl.³ .......................................... H02M 7/217
[52] U.S. Cl. ...................................... 363/127; 363/147
[58] Field of Search .................... 357/41, 51; 363/125, 363/127, 147

[56] References Cited

U.S. PATENT DOCUMENTS

| | | | |
|---|---|---|---|
| 3,874,955 | 4/1975 | Arita | 357/51 X |
| 3,940,681 | 2/1976 | Ohsawa | 363/127 |
| 4,068,295 | 1/1978 | Portmann | 363/147 X |
| 4,166,288 | 8/1979 | Stein | 363/147 |

Primary Examiner—William M. Shoop
Attorney, Agent, or Firm—Wender, Murase & White

[57] ABSTRACT

The converter comprises a first MOS transistor fed by a current source or by a current-limiting element and it receives through an input capacitor the alternating input voltage. The first transistor is biased by a second MOS transistor the distance drain-source of which is connected between the gate and the drain of the first transistor. The second transistor is biased on its gate by a voltage of reference in such a way that its equivalent internal resistance takes a very high value. A filter capacitor is connected between drain and source of the first transistor. A direct voltage is delivered on the drain of the first transistor the value of which being function of the amplitude of the alternating input voltage. The converter can be implemented by any conventional technology for MOS integrated circuits because it uses only standards elements which are easily integrated.

10 Claims, 18 Drawing Figures

ALTERNATING TO DIRECT VOLTAGE CONVERTER

BACKGROUND OF THE INVENTION

The present invention relates to an alternating to direct voltage converter in form of an integrated circuit comprising on a same substrate at least a first field effect transistor with insulated gate, a current-limiting means feeding said first transistor and a first coupling capacitor connected to the input of said first transistor for controlling said first transistor by said alternating voltage.

Figure 1:
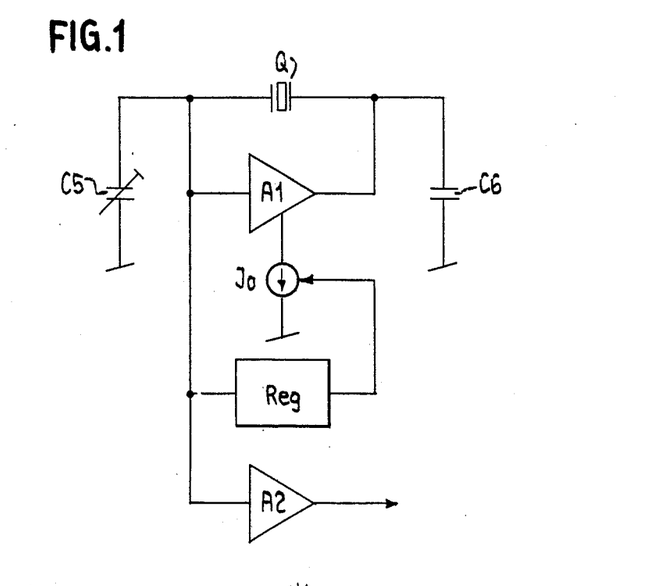
FIG. 1 is the block diagram of a regulated quartz crystal oscillator.

Such a converter is provided for the regulating circuit Reg of a quartz crystal oscillator, e.g. for an electronic watch. FIG. 1 shows the circuit diagram of an oscillator comprising a converter according to the present invention. The properly so called oscillator comprises an amplifier A1, a quartz crystal resonator Q and two phase-shifting capacitors C5 and C6. The amplifier A1 is fed by a current source Io like the one described in the U.S. Patent Application Ser. No. 968,902, for maintaining the current of the oscillator at a determined, relatively small value. The regulating circuit Reg of FIG. 1 permits, by acting on the current source Io in function of the amplitude of the alternating voltage of the oscillator to further reduce the power consumption of the circuit. An amplifier A2 receives the relatively small alternating signal of the oscillator and delivers an amplified signal having sufficient amplitude for adequately driving stages normally connected to the oscillator.

Figure 2:
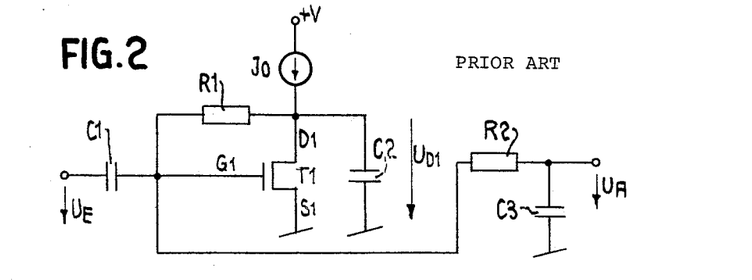
FIG. 2 is the circuit diagram of a known amplitude detector.

From FIG. 2 of the document (1), "ESSCIRC 1976, Toulouse, New analog CMOS IC's based on weak inversion operation, E. Vittoz and S. Fellrath, Centre Electronique Horloger SA, Neuchâtel, Switzerland", it is known an amplitude detector or alternating to direct voltage converter comprising a transistor T1 fed by a current source (T2,T6) and further comprising associated elements like R1, R2, C1, C2 and C3. In such a circuit, the resistors R1 and R2 must have a very high impedance, in the order of magnitude of 100 megohms and it is proposed to implement them by back to back polycrystalline diodes. Such diodes can be produced by a particular technology only (Si-gate technology), which considerably limits their possibilities of applications.

SUMMARY OF THE INVENTION

An object of the present invention is to realize an alternating to direct voltage converter having a configuration less complicated than the one of the circuit known from the above mentioned publication (1) and capable to be integrated by a conventional technology of the CMOS circuits. To this end, the converter is in form of an integrated circuit comprising on a same substrate at least a first field effect transistor with insulated gate, a current-limiting means feeding said first transistor and a first coupling capacitor connected to the input of said first transistor for controlling said first transistor by said alternating voltage, further comprising a second field effect transistor with insulated gate connected between the input and the output of the first transistor, a second capacitor connected to the output of the first transistor for short-circuiting said output for the alternating voltage signals, said first transistor producing on said output a direct voltage function of the amplitude of said alternating voltage.

The invention will be described further by way of example, with reference to the accompanying drawings.

DESCRIPTION OF THE PREFERRED EMBODIMENT

FIG. 2 shows the circuit diagram of a known amplitude detector according to (1). This amplitude detector converts the alternating input voltage $U_E$ into a direct output voltage $U_A$. The elements R2, C3 form a filter for the alternating voltage on the gate G1 of T1. The value of the output voltage $U_A$, which is equal to the mean value of the gate voltage of the transistor T1, is a function of the amplitude of the alternating input voltage $U_E$.

It is to be seen that in the absence of the input voltage $U_E$ or when the output terminal is connected e.g. to the gate of a MOS transistor, no direct current flows through either R1 or R2. In this case, the potentials on the drain D1, on the gate G1 and on the capacitor C3 are equals: $U_{D1}=U_{G1}=U_A$. The only direct current circulating in the circuit is the current Io delivered in the transistor T1 by the current source or by a current limiting element. The preceding shows that the elements R2 (resistor) and C3 (capacitor) may be spared without appreciably influencing the transfer function of the circuit.

Figure 3:
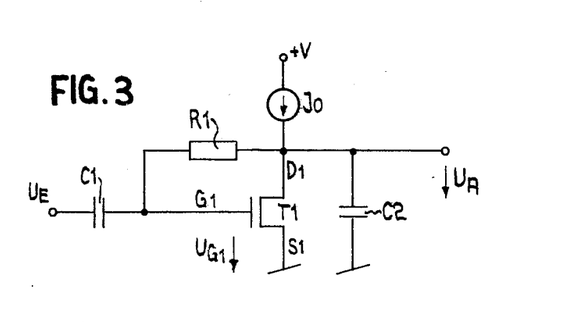
FIG. 3 shows the principle of an alternating to direct voltage converter according to the present invention.

The circuit of FIG. 2 but without the elements R2,C3 is represented in FIG. 3. The operation of the circuit of FIG. 3 is the following.

Figure 4:
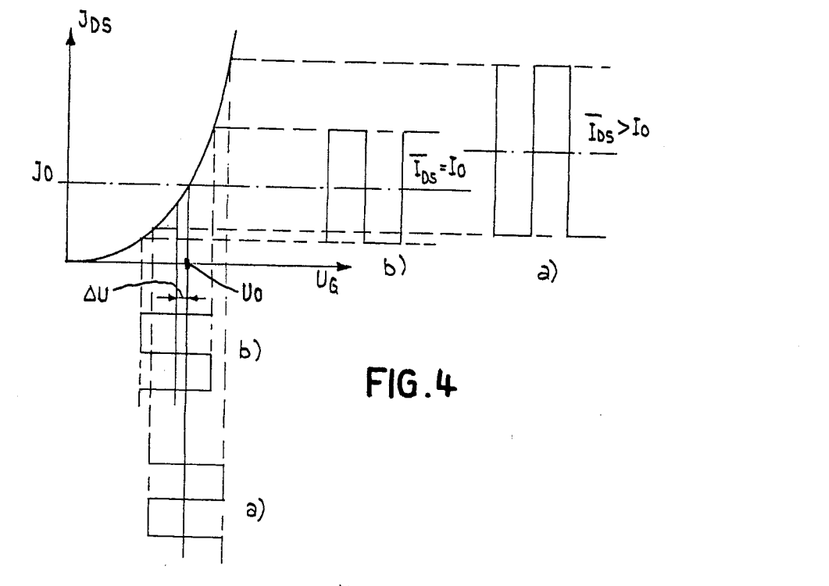
FIG. 4 shows the characteristic of the drain current in function of the gate-source voltage of the transistor T1 of FIG. 3.

Without any alternating input voltage, the operating point of transistor T1 is determined by the current Io which produces a voltage on the drain D1 and on the gate G1 of transistor T1. This voltage $U_A=U_{G1}=U_o$ is determined by the characteristic of the drain current in function of the gate-source voltage of T1, as indicated in FIG. 4. In FIG. 4a, an alternating voltage $U_E$ directly superposed on Uo produces a strong increase of the current $I_{DS}$ during the positive half periods of $U_E$ without producing a noticeable decrease of this current during the negative half periods of $U_E$. As a result, the mean current in the transistor has a tendency to increase toward a value noticeably greater than the current Io delivered by the current source. However, the current Io is maintained constant by the current source, so that the capacitor C2 is forced to discharge which produces a decrease of $U_A$. Because the mean value of the gate voltage $U_G$ is the same than $U_A$, this gate voltage must also decrease until the mean current in the transistor T1 becomes again equal to Io. This is indicated in FIG. 4b which shows that the mean current in the transistor becomes again equal to Io when the voltage $\bar{U}_{G1}$ has decreased by an amount $\Delta U$. It is easily seen that the greater the amplitude of the alternating input signal $U_E$, the more different from $U_o$ are the output voltage $U_A$ and the mean gate voltage $\bar{U}_{G1}$ (equal to $U_A$). The shifting of an amount $\Delta U$ of the operating point is therefore a function of the alternating input voltage.

Figure 5:
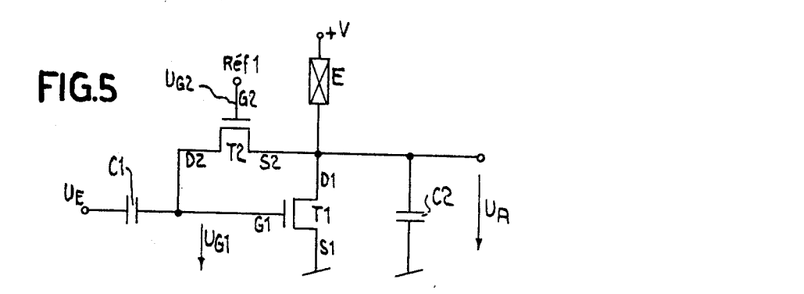
FIG. 5 is the circuit diagram of the converter of FIG. 3.

For an input capacitance of 1 pF and an input signal having a frequency of 32 kHz, the required time constant is about 100 micosecond, so that the resistor R1 must have a value in the order of magnitude of 100 megohms. Resistors with such a high value are very difficult to implement in an integrated circuit. In the previously cited known publication (1) we have already seen that these resistors are implemented by back to back polycrystalline diodes requiring a particular manufacturing technology. In the circuit according to the present invention the resistor R1 is realized by a MOS transistor which is integrated by conventional technology. This transistor, designated by T2 in FIG. 5, is biased in such manner to have an equivalent resistance of a very high value between drain and source. The dimensioning of transistor T1 and of current Io is done by taking into consideration that without any alternating input signal the output voltage $U_A=U_o$ is about the same than the threshold voltage $U_T$ of transistor T1. The channel of transistor T2 with the terminals S2 and D2 is then at the potential of the threshold voltage of transistor T1. In FIG. 5, transistor T2 is biased by a gate voltage $U_{G2}$ which is choosen so that it is only weakly conducting. The voltage between gate and source or drain of T2 must therefore have a value about equal to the threshold voltage $U_T$. The value of the voltage $U_{G2}$ against ground is about twice the threshold voltage.

Figure 6:
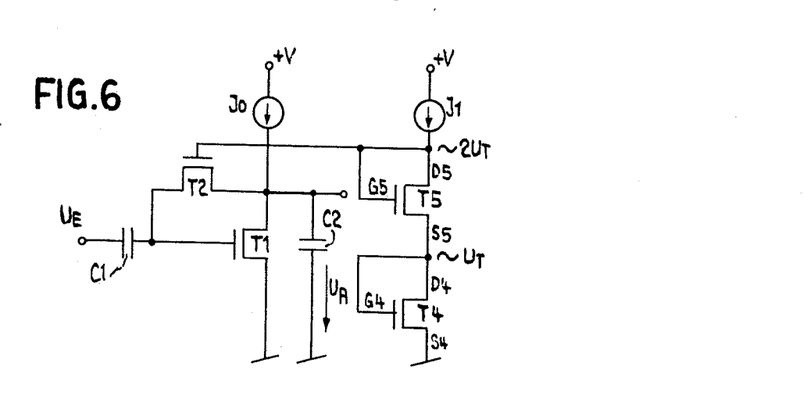
FIG. 6 is the circuit diagram of a first embodiment of the converter of FIG. 5.
Figure 7:
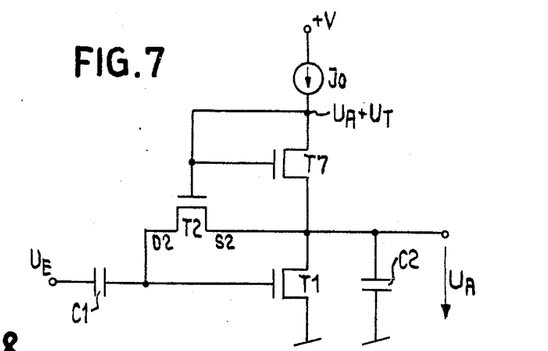
FIG. 7 is the circuit diagram of another embodiment of the converter of FIG. 5.

FIG. 6 shows that the gate voltage $U_{G2}$ of the circuit of FIG. 5 may be obtained with an additional current source I1 feeding two MOS transistors T4 and T5 connected in series, the drain of each transistor being connected to its gate. FIG. 7 shows a circuit simpler than the one of FIG. 6, which does not require any additional current source but only an additional transistor T7 connected in series with the transistor T1. The series connection of the transistors T1 and T7 of FIG. 7 replaces the series connection of T5 and T4 of FIG. 6 for the production of the bias voltage having a value of $U_A+U_T$.

The transfer function of the circuit of FIG. 7 is slightly different from the one of the circuit of FIG. 6 because in FIG. 7 the voltage of reference for the gate of T2 is constant with respect to the output voltage $U_A$ (it varies with respect to ground in function of the input voltage), while in the circuit of FIG. 6 it is constant with respect to ground and varies with respect to the output. For the impedance of the transistor however, it is the gate-source voltage which is of importance, that is the voltage between gate and output.

Figure 8:
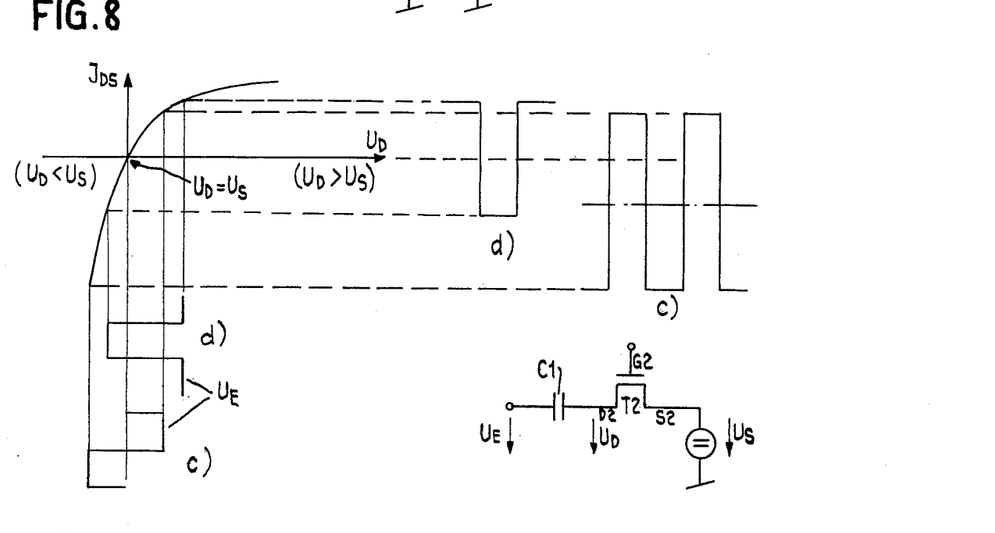
FIG. 8 shows the characteristic of the drain current in function of the drain-source voltage of the transistor T2 of FIG. 5.

The transistor T2 of FIGS. 5, 6 and 7 has an influence on the transfer function of the circuit because its characteristic $I_{DS}=f(U_D)$ is not symmetrical, as shown in FIG. 8. In accordance with FIG. 8c, an alternating signal, symmetrical with respect to $U_S$ and applied to the drain D2, produces a strong current in the negative half periods, particularly for the high values of the input voltage, while, in the positive half periods, the current is small and nearly constant as soon as the input voltage increases above a certain value. The dc voltage component is not zero. Therefore, the capacitor C1 must charge so that $\bar{U}_D$ becomes more positive than $U_S$. FIG. 8d shows the case where the equilibrium is again reached: The rectangular input signal $U_E$ superposed to a mean voltage $\bar{U}_D$ more positive than $U_S$ produces a current in transistor T2 having a zero dc component. This condition can also be obtained by shifting $U_S$ against a more negative value in order for $\bar{U}_D$ to remain constant.

Figure 9:
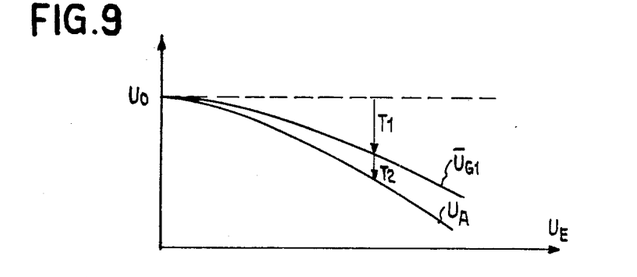
FIG. 9 shows the transfer function of the converter according to the present invention.

Consequently, the conditions in the circuit of FIG. 5 are the following: On the one hand, when the amplitude of the input signal increases, the mean gate voltage $\bar{U}_{G1}$ of transistor T1 decreases because of the non-linearity of the characteristic $I_{DS}=f(U_G)$ of this transistor. The voltage $\bar{U}_{G1}$ of T1 depends only from Io and $U_E$. On the other hand, the transistor T2 produces, as already seen above, a shift between the level of the mean gate voltage $\bar{U}_{G1}$ and the output voltage $U_A$ in such a way that $U_A$ which which corresponds to $U_S$ of FIG. 8 becomes smaller than $\bar{U}_{G1}$ which in its turn corresponds to $U_D$. It is to be seen that both effects combine in the same direction, as indicated in FIG. 9. The transfer function characteristic as illustrated in FIG. 9 may be adapted to the particular requirements of the circuit and, in practice, it is advantageously determined empirically.

Figure 10:
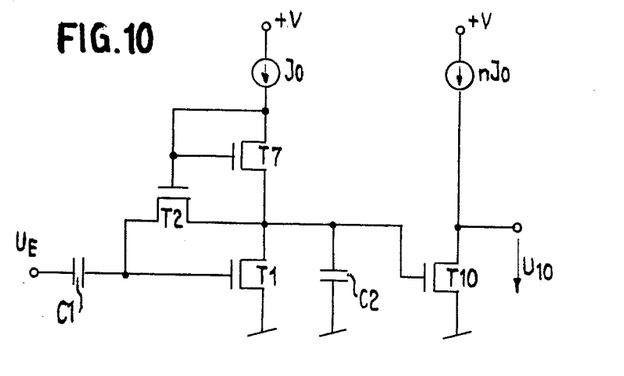
FIG. 10 shows the converter of FIG. 7 connected to an electronic circuit.
Figure 11:
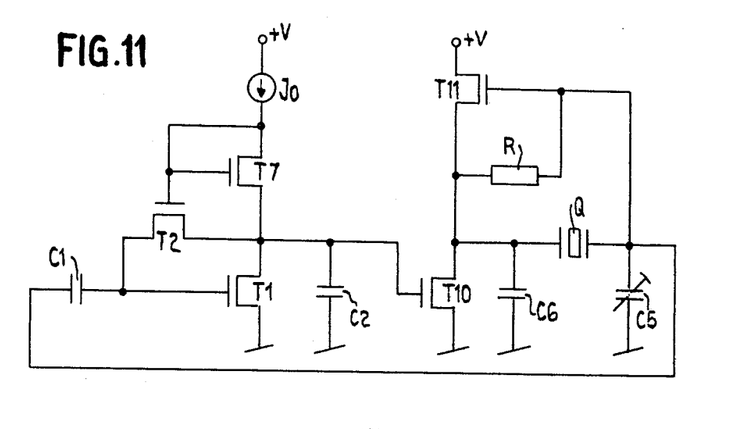
FIG. 11 is the circuit diagram of a regulated oscillator comprising the converter of FIG. 7, and FIGS. 12–18 show various embodiments of the converter of FIG. 5.

The output voltage $U_A$ is a function of the current Io as well as of the threshold voltage of transistor T1. However, this is not a real drawback because in most cases the voltage $U_A$ is further treated in the integrated circuit. The converter is then only a small unit of an electronic subassembly. It is possible, in the case of a well dimensioned association with other elements of the circuit, to entirely compensate for the influence of the two above mentioned parameters from which depends the output voltage $U_A$ FIG. 10 shows a first application of the converter of FIG. 7 as an amplitude detector. It is to be seen that the output voltage $U_A$ of the converter is filtered by a capacitor C2 and that it controls the gate of a transistor T10 fed by a current source nIo. The circuit is designed so that the output voltage U10, across T10, is at level 1 if $U_E>U_{Ref}$ and at level 0 if $U_E<U_{Ref}$. Another application of the converter of FIG. 7 is illustrated in FIG. 11 which is the circuit diagram of an oscilator with a very small current consumption. The circuit of FIG. 11 represents in principle the oscillator of FIG. 1 but without the amplfier A2. The quartz crystal resonator Q is connected between the input and the output of the transistor T11 which in its turn is connected in series with a transistor T10 the gate of which is controlled by the converter of FIG. 7 the output voltage of which being filtered by the capacitor C2. If the alternating output voltage of the oscillator across C5 increases, the output voltage of the converter across C2 decreases which reduces the conduction of T10, so that the current in T11 decreases. The amplitude of the signal across C5 is adjusted to a small value which reduces the current consumption of the oscillator. The capacitor C2 may be eliminated if the input capacity of T10 is sufficiently high.

The above mentioned cases of application show that the converter may be used in many different circuits. It comprises less elements than the circuit known from prior art in accordance with (1) and it may be implemented by any existing technology of the integrated circuits because it uses only standard elements which are normally integrated in parcels of thousands of pieces easily manufactured. With respect to the known circuit, the slope of the output voltage in function of the alternating input voltage is higher which permits, as the case may be, to spare additional amplifier stages. Moreover, the dimensioning of the circuit is not critical, so that e.g. the cut-off frequency of the converter may be choosen in order for the stray radiations of low frequencies created by the converter to be eliminated.

FIGS. 12–18 show further different embodiments of the converter of FIG. 5 having determined advantages in accordance with their particular applications.

Figure 12:
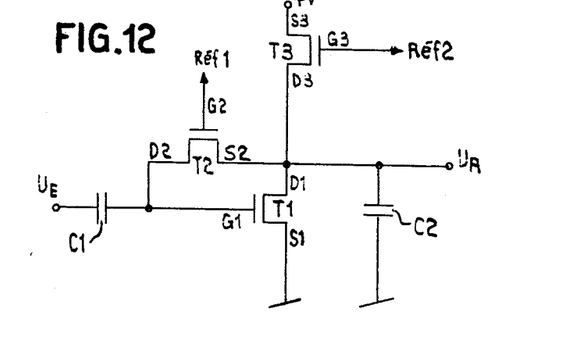

The circuit of FIG. 12 shows that the current source of FIG. 5 is implemented e.g. by a transistor T3 of complementary type of conductivity with respect to the one of T1, the source S3 of transistor T3 being connected to the positive pole of the power source, the drain D3 to the drain D1 of transistor T1 and the gate G3 to a second potential of reference Ref 2, the gate G2 of transistor T2 being connected to a first potential of reference Ref 1.

Figure 13:
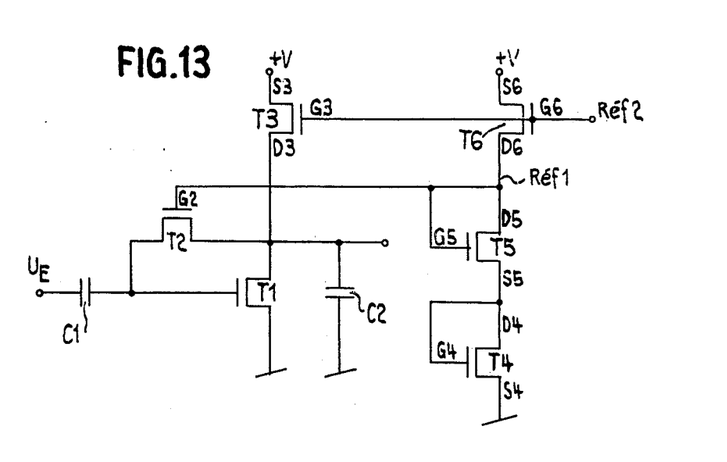

The circuit of FIG. 13 shows that the current sources Io and I1 of the circuit of FIG. 6 are implemented in true concordance with each other by the transistors T3 and T6 respectively, of which the sources S3 and S6 are connected to the positive pole of the supply and the gates G3 and G6 are connected together and to a second potential of reference, the first potential of reference being the one of the gate G2 of T2 and of the drain D5 of T5.

Figure 14:
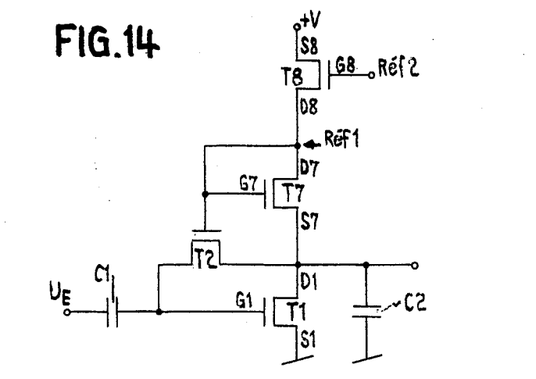
Figure 15:
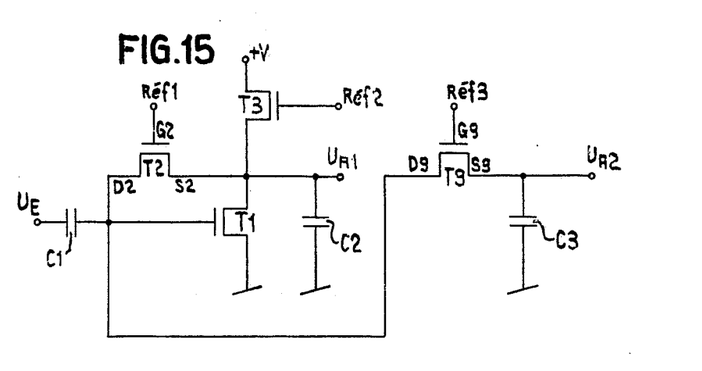
Figure 16:
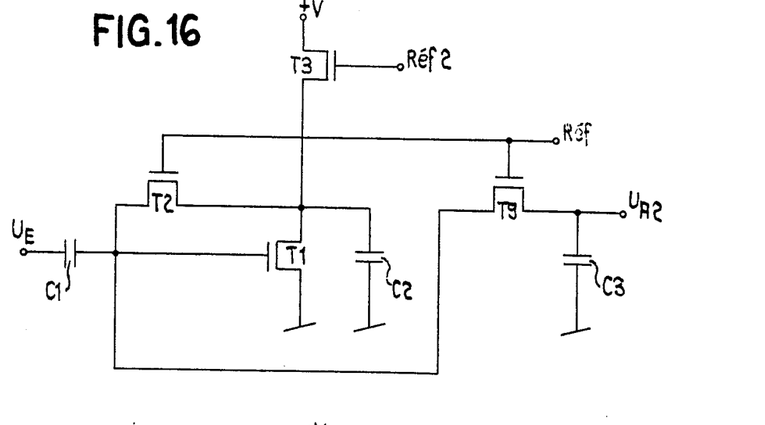

FIG. 14 shows how the current source of the circuit of FIG. 7 is implemented by a transistor T8 in series with the transistor T7 the source S8 of which is connected to the positive pole of the supply, the drain D8 to the drain D7 of transistor T7 and the gate G8 to a second potential of reference. FIG. 15 shows how it is possible to implement a structure equivalent to the already known one according to (1) with conventional components. In the circuit of FIG. 15, the capacitor C2 may be eliminated and the transistor T2 may operate as a voltage amplifier delivering the output voltage $U_{A1}$ which is the amplified alternating input voltage $U_E$. The output voltage $U_{A2}$ is the direct voltage function of the amplitude of the alternating input voltage $U_E$. The output voltage $U_{A2}$ is filtered by the equivalent resistance of transistor T9 forming a low-pass filter with the capacitor C2. The gate G9 of transistor T9 is biased by a third potential of reference. The potentials of reference Ref 1 and Ref 3 may be different from each other, e.g. because it is necessary to have different time constants, or identical ones as shown in FIG. 16.

Figure 17:
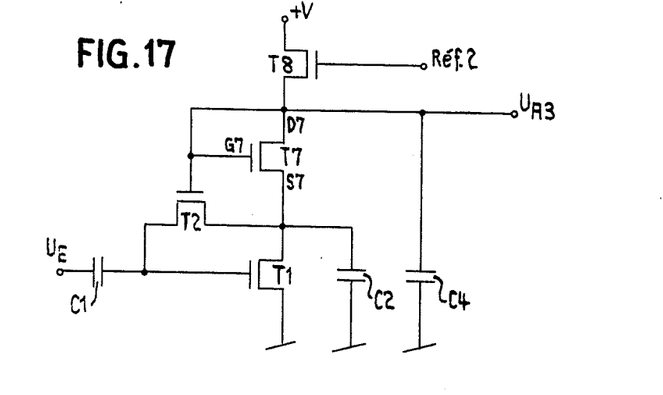

FIG. 17 represents the circuit of FIG. 14 in which a capacitor C4 is connected between the drain D7 of transistor T7 and ground. The drain D7 of T7 may then be used as an output of the converter delivering the voltage $U_{A3}$. The current through T7 being constant, the voltage between drain and source of T7 is also constant. As the case may be, either capacitor C2 or capacitor C4 may be spared. The circuit of FIG. 17 is particularly well suited for the applications in the differential amplifiers.

Figure 18:
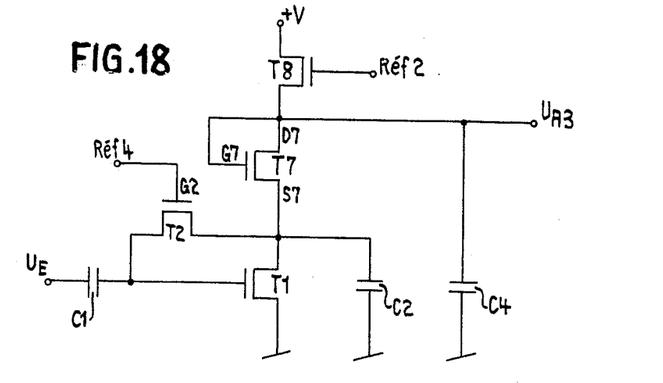

Finally, FIG. 18 shows that in the circuit of FIG. 17 it is not obligatory to connect the gate G2 of T2 to the output S3. The gate G2 may also be connected to a fourth potential of reference Ref 4. This presents the advantage with respect to the circuit of FIG. 17 that the voltage drop in T7 may be adapted to the requirements of the following stage connected at the output delivering the voltage $U_{A3}$ without for the output voltage $U_{A3}$ to take a value not compatible with the requirements for the bias of T2.

The preceding examples show that the converter is easily adapted to the requirements of the different cases of applications without any necessity to change or modify its basic structure. This, combined with the fact that it can be implemented by any MOS technology gives to the converter according to the present invention a quite universal range of possible applications.

I claim:

1. Alternating to direct voltage converter in form of an integrated circuit comprising on a same substrate at least a first field effect transistor with insulated gate, a current limiting means feeding said first transistor and a first coupling capacitor connected to the input of said first transistor for controlling said first transistor by said alternating voltage, further comprising a second field effect transistor with insulated gate connected between the input and the output of the first transistor, a second capacitor connected to the output of the first transistor for short-circuiting said output for the alternating voltage signals, said first transistor producing on said output a direct voltage function of the amptitude of said alternating voltage.

2. Converter according to claim 1, wherein the source of said first transistor is connected to the first pole of a power source, the drain of the first transistor is connected through current-limiting means to the second pole of the power source, the gate of the first transistor is biased by a second transistor the source of which is connected to the drain of the first transistor, the drain of the second transistor being connected to the gate of the first transistor, the gate of the second transistor being biased by a first potential of reference for producing a very high equivalent impedance, said second transistor being connected between the drain and the source of said first transistor.

3. Converter according to claim 2, wherein the current-limiting means comprises at least a third transistor having a complementary type conductivity with respect to the first transistor, the source of said third transistor being connected to the second pole of said power source, the drain of said third transistor being connected to the drain of the first transistor and the gate of the third transistor being biased by a second potential of reference.

4. Converter according to claim 2 or 3, wherein said first potential of reference is produced by a fourth transistor connected in series with a fifth transistor, the source of the fourth transistor being connected to the first pole of said power source, the drain and the gate of said fourth transistor being connected together and to the source of the fifth transistor, the drain and the gate of the fifth transistor being connected together and to the gate of the second transistor for delivering to said gate of the second transistor said first potential of reference, said fourth and fifth transistors being fed by a sixth transistor the drain of which is connected to the drain of the fifth transistor, the gate of the sixth transistor being connected to said second potential of reference and the source of the sixth transistor being connected to the second pole of said power source.

5. Converter according to claim 2, wherein said current-limiting means comprises at least a seventh transistor having a conductivity of the same type as that of the first transistor and an eighth transistor having complementary type of conductivity with respect to the seventh transistor, said seventh and eighth transistors being connected in series, the drains of the seventh and the eighth transistors being connected together and to the gate of the seventh transistor for delivering said first potential of reference, the source of the seventh transistor being connected to the drain of the first transistor, the source of the eighth transistor being connected to the second pole of said power source and the gate of the eighth transistor being connected to said second potential of reference.

6. Converter according to claim 5, wherein the drain of said seventh transistor is connected to the first pole of a fourth capacitor whose second pole is connected to the first pole of said power source, said first pole of the fourth capacitor forming a thid output of said converter.

7. Converter according to claim 6, wherein the gate of said second transistor is biased by a fourth potential of reference.

8. Converter according to claim 2, further comprising a ninth transistor and a third capacitor for forming an additional output of said converter, the drain of said ninth transistor being connected to the drain of the second transistor, the gate of the ninth transistor being connected to a third potential of reference and the source of the ninth transistor being connected to the first pole of said third capacitor, the second pole of which is connected to the first pole of said power source, said first pole of the third capacitor forming said additional output, the direct voltage on said additional output being function of said alternating voltage.

9. Converter according to claim 8, wherein said first and said third potential of reference are equal.

10. Converter according to claim 1, 6 or 8, wherein at least one of said second, third or fourth output capacitors is formed by stray capacitance of said integrated circuit or by the input capacitance of the following electronic stages which are connected to one of said outputs.

* * * * *